(12) United States Patent
Ohno

(10) Patent No.: US 8,389,423 B2
(45) Date of Patent: Mar. 5, 2013

(54) SEMICONDUCTOR DEVICE MANUFACTURING METHOD

(75) Inventor: Hiroshi Ohno, Tokyo (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 13/422,153

(22) Filed: Mar. 16, 2012

(65) Prior Publication Data

US 2012/0178269 A1   Jul. 12, 2012

Related U.S. Application Data

(63) Continuation of application No. PCT/JP2009/066453, filed on Sep. 18, 2009.

(51) Int. Cl.
*H01L 21/00* (2006.01)

(52) U.S. Cl. .................................... 438/795; 438/799

(58) Field of Classification Search .............. 438/795, 438/799, 660, 662, 715
See application file for complete search history.

(56) References Cited

U.S. PATENT DOCUMENTS

| | | |
|---|---|---|
| 8,101,974 B2 | 1/2012 | Ohno et al. |
| 2008/0045040 A1 | 2/2008 | Nakao |
| 2008/0203540 A1 | 8/2008 | Anderson et al. |

FOREIGN PATENT DOCUMENTS

| | | |
|---|---|---|
| JP | 2008-047923 A | 2/2008 |
| JP | 2008-211214 A | 9/2008 |
| JP | 2009-141075 A | 6/2009 |

OTHER PUBLICATIONS

International Search Report dated Dec. 8, 2009 from PCT/JP2009/066453.
Shima, et al.; "Ultra-Shallow Junction Formation by Non-Melt Laser Spike Annealing and its Application to Complementary Metal Oxide Semiconductor Devices in 65-nm Node"; Japanese Journal of Applied Physics; vol. 45, No. 7, 2006, pp. 5708-5715.

*Primary Examiner* — Charles Garber
*Assistant Examiner* — Reema Patel
(74) *Attorney, Agent, or Firm* — Ohlandt, Greeley, Ruggiero & Perle, L.L.P.

(57) ABSTRACT

One embodiment of the present invention provides a semiconductor device manufacturing method, including: performing a laser spike annealing, by irradiating light, whose wavelength is 10 μm to 11 μm, onto a semiconductor substrate including: an active area; a circuit pattern; and a dummy pattern formed at a position, whose distance from an end of the active area is equal to or more than 10 μm and equal to or less than 11 μm, at a pitch equal to or more than 10 nm and equal to or less than 510 nm, while setting an angle formed between an arrangement direction of the dummy pattern and a projection direction of the light to be equal to or more than 0° and equal to or less than 30°.

2 Claims, 16 Drawing Sheets

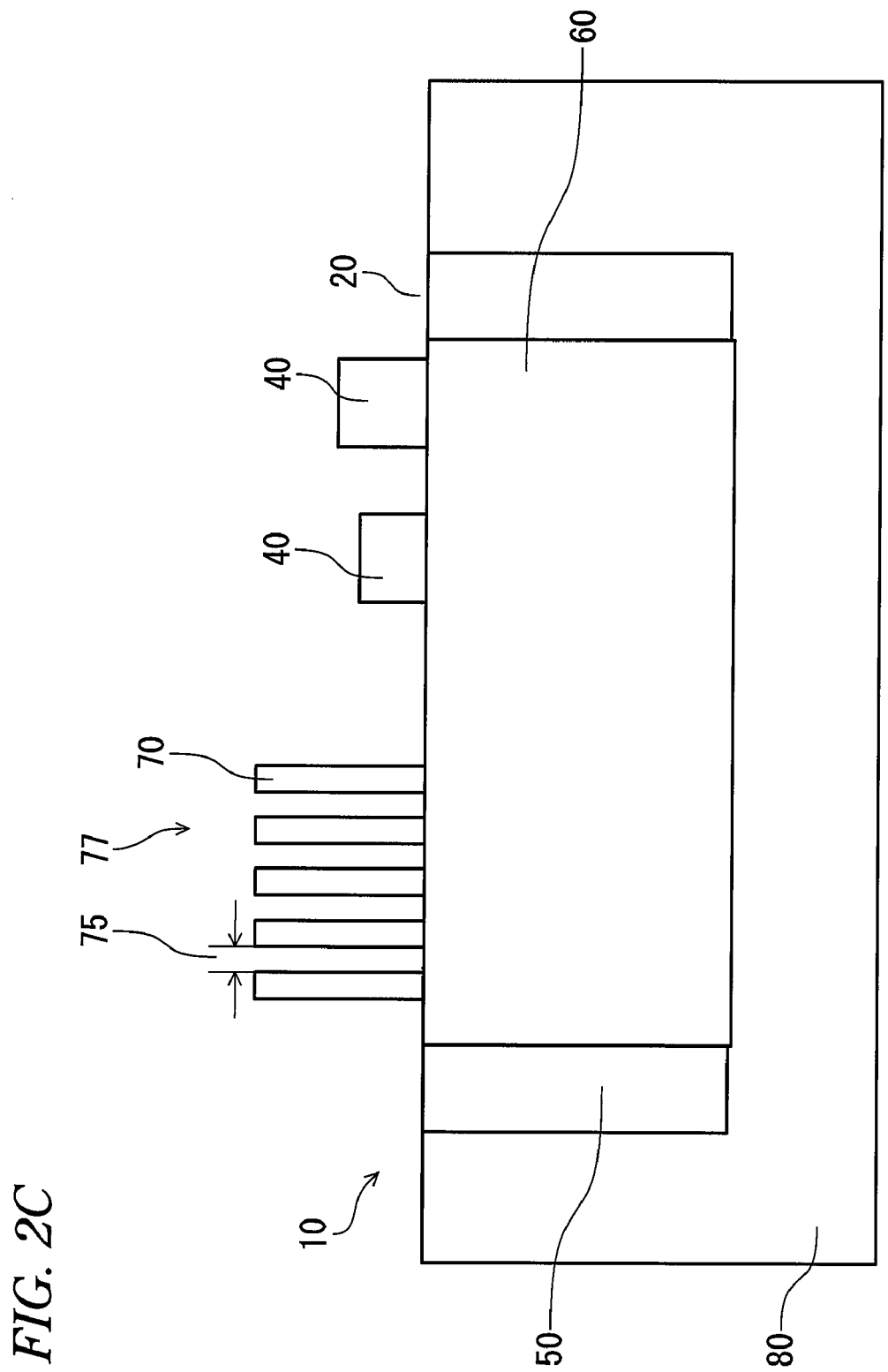

SEMICONDUCTOR DEVICE MANUFACTURING METHOD

CROSS-REFERENCE TO RELATED APPLICATION(S)

This is a Continuation Application of PCT Application No. PCT/JP09/066453, filed on Sep. 18, 2009, which was published under PCT Article 21(2) in Japanese, the entire contents of which are incorporated herein by reference.

FIELD

Embodiments described herein relate generally to a semiconductor device manufacturing method.

BACKGROUND

There is disclosed techniques relating to a semiconductor device capable of reducing the temperature variation of a semiconductor substrate by forming a dummy pattern at a place, at which temperature has been lowered, on the semiconductor substrate to thereby raise the temperature at the place at which the temperature has been lowered.

However, there is no technique in which the temperature at a place, at which temperature has been raised, on the semiconductor substrate is lowered.

BRIEF DESCRIPTION OF DRAWINGS

A general architecture that implements the various features of the present invention will now be described with reference to the drawings. The drawings and the associated descriptions are provided to illustrate embodiments and not to limit the scope of the present invention.

FIGS. 2B to 2D illustrate manufacturing processes for the semiconductor device according to Embodiment 1.

DETAILED DESCRIPTION

Figure 1:
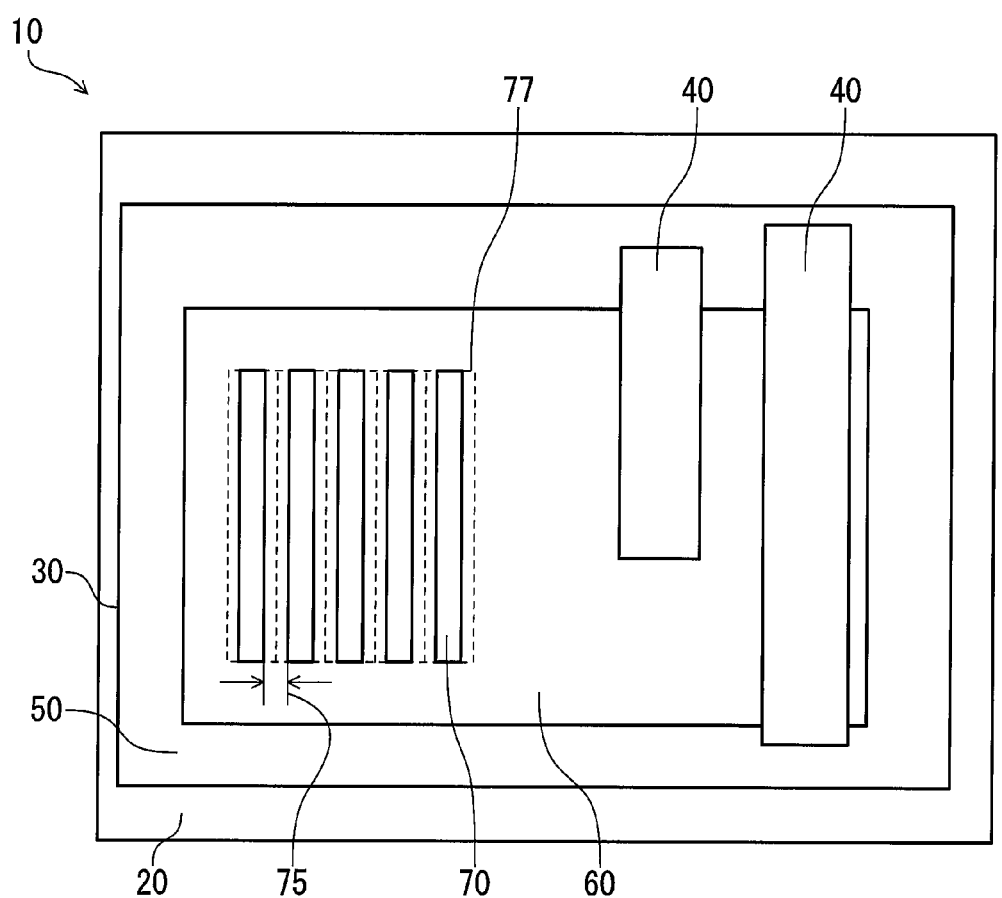
FIG. 1 illustrates a semiconductor device according to Embodiment 1.

In general, one embodiment provides a semiconductor device manufacturing method, including: performing a laser spike annealing, by irradiating light, whose wavelength is equal to or more than 10 μm and equal to or less than 11 μm, onto a principal surface of a semiconductor substrate, the semiconductor substrate including: an active area; a circuit pattern formed on the active area, the circuit pattern being associated with a circuit operation; and a dummy pattern formed on the active area and at a position, whose distance from an end of the active area is equal to or more than 10 μm and equal to or less than 11 μm, the dummy pattern being associated with no circuit operation, the dummy pattern including a plurality of cyclically arranged dummy gate conductors at a pitch equal to or more than 10 nm and equal to or less than 510 nm, while setting an angle formed between an arrangement direction of the dummy gate conductors and a projection direction of the light to be equal to or more than 0° and equal to or less than 30°.

Here, the arrangement direction indicates that the direction along which the dummy gates are arranged in plurality.

Hereinafter, embodiments are described with reference to the drawings. Components common to plural embodiments are designated with same reference numerals in the drawings. Redundant description of such components is omitted.

(Embodiment 1)

FIG. 1 illustrates a semiconductor device 10 according to Embodiment 1. In the semiconductor device 10, a circuit pattern region 30 having an integrated circuit pattern for performing a circuit operation is formed on a semiconductor substrate principal surface 20.

In the circuit pattern region 30, a GC (Gate Conductor, i.e., a gate) 40, a STI (Shallow Trench Isolation: element isolation) region 50, and an AA (Active Area) 60 are formed. The AA 60 corresponds to an area for forming a source/drain region and a channel region. The GC 40 and the AA 60 are formed mainly of Si. The STI-region 50 is formed mainly of $SiO_2$.

The film thickness of the GC 40 ranges from 100 nm to 300 nm. Both of the length in a channel length direction and that in a channel width direction of the AA 60 are equal to or longer than 10 μm and equal to or less than 500 μm. The channel length direction designates a direction in which the conduction between a source and a drain occurs. The channel width direction designates a direction perpendicular to the channel length direction.

The AA 60 is provided with a dummy pattern 77 in which plural dummy GCs (Gate Conductors, i.e., dummy gates) 70 are cyclically arranged.

The plural dummy GCs 70 forming the dummy pattern 77 are provided at a distance that is equal to or longer than 10 μm and equal to and shorter than 11 μm from at least one of both ends of the AA 60 such that the direction of arranging the plural dummy GCs 70 is in agreement with the channel length direction. If a part of the dummy pattern 77 exists in the above range of the distance equal to or longer than 10 μm and equal to and shorter than 11 μm, the advantages of Embodiment 1 can be obtained. As to an "end" of the AA 60 below, the advantages of Embodiment 1 can be obtained whatever direction the direction of the "end" is. The dummy GC 70 has a rectangular shape. The short axis direction of the dummy GC 70 is in agreement with a channel length direction and the long axis direction of the dummy GC 70 is in agreement with a channel width direction. The length in the long axis direction of the dummy GC 70 is set at 100 nm. The length in the channel width direction of the dummy GC 70 is in agreement with that in the channel width direction of the AA 60.

The interval between the dummy GCs 70 has a pitch 75. The pitch 75 is equal to or longer than 10 nm and equal to or less than 510 nm. In addition, the film-thickness of the dummy GC 70 is equal to or thicker than 100 nm and equal to or thinner than 300 nm.

The dummy pattern 77 does not function as the circuit, but maintains the equilibrium of temperature. For example, the dummy pattern 77 can be formed by inhibiting wiring from being performed in a posterior process for forming a semiconductor device, or by inhibiting the source/drain region from being formed. On the other hand, the GC 40 is provided to function as a channel, and thus, source/drain regions are formed at both ends thereof. Preferably, the dummy pattern 77 has a rectangular shape, because the formation thereof is facilitated.

Figure 2A:
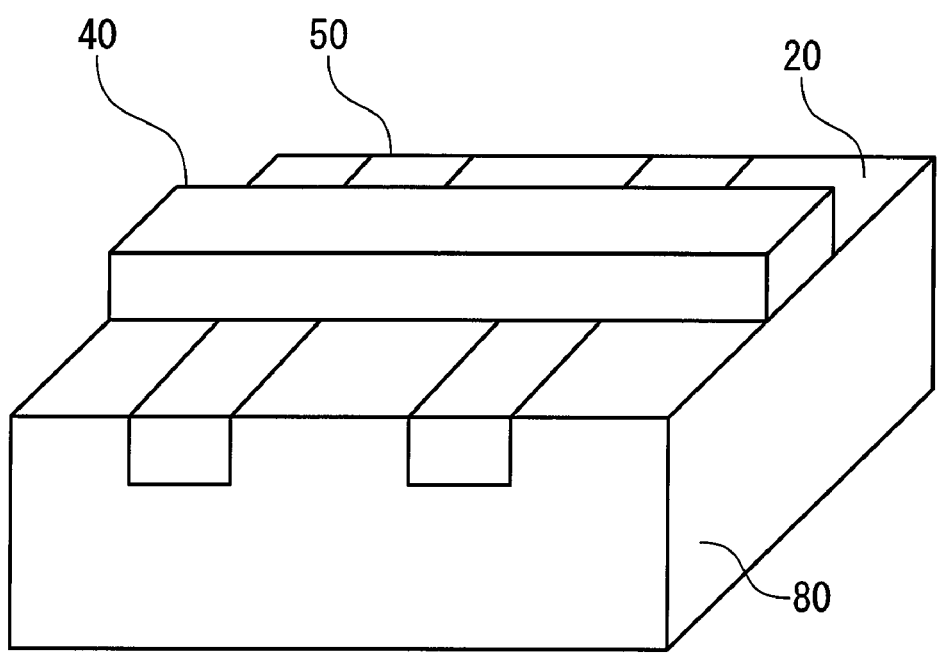
FIG. 2A illustrates a fundamental structure of the semiconductor device according to Embodiment 1.

In the semiconductor device 10, the GC 40 and the STI-region 50 are formed on a semiconductor substrate 80, as illustrated in FIG. 2A. The semiconductor substrate principal surface 20 corresponds to a surface of the semiconductor substrate 80, on which a semiconductor integrated circuit is arranged.

Next, a manufacturing process and an operation of the semiconductor device 10 are described hereinafter.

Figure 2B:
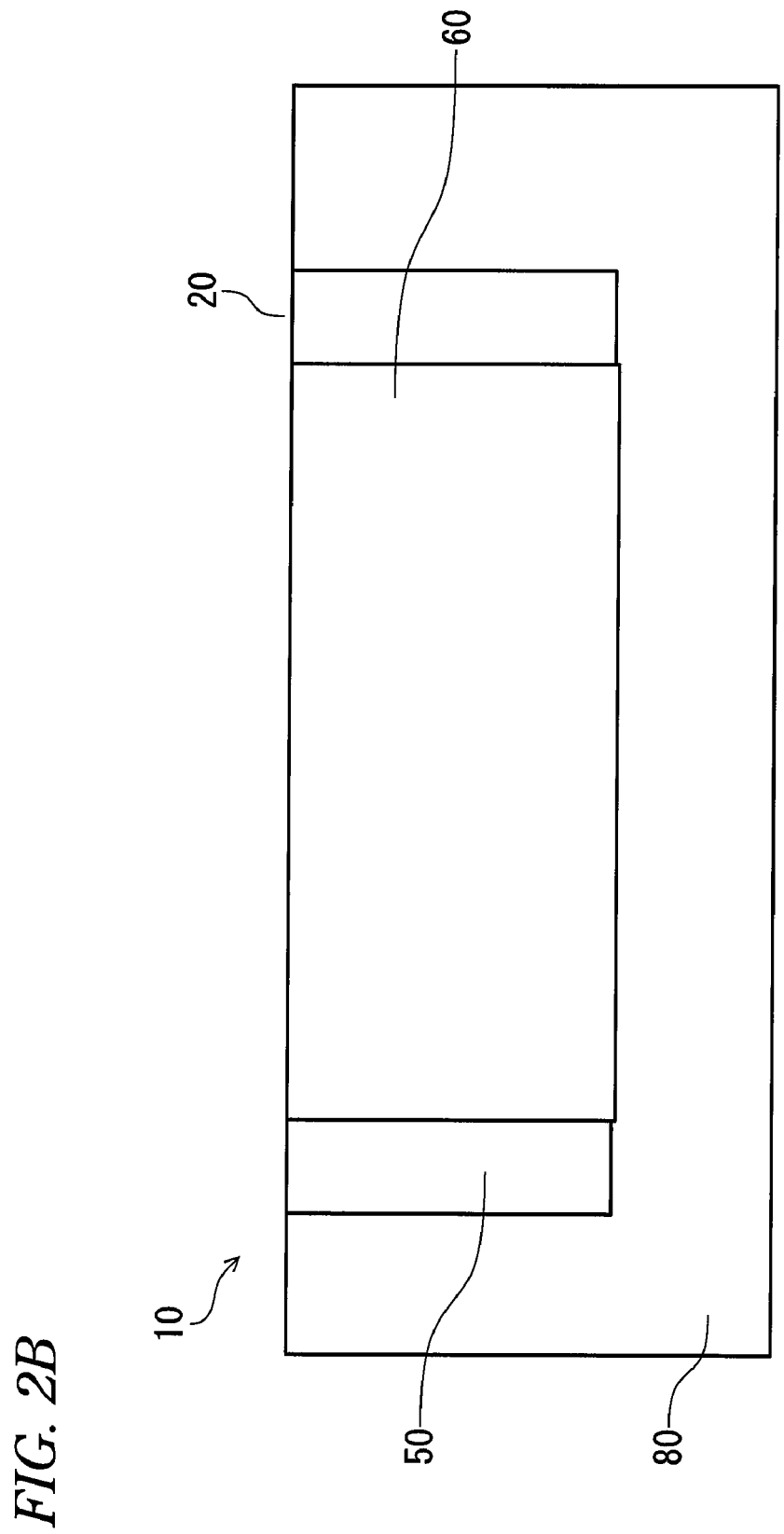

FIG. 2B illustrates the manufacturing process of the semiconductor device 10 according to Embodiment 1. FIG. 2B illustrates a cross-sectional view of the semiconductor device 10 illustrated in FIG. 1, which is taken along the channel length direction and shows a state before the dummy pattern 77 and the GC 40 are formed. FIG. 2C illustrates a cross-sectional view of the semiconductor device 10 according to Embodiment 1, which is taken along the channel length direction.

The configuration illustrated in FIG. 2B is obtained by stacking a nitride film on the semiconductor substrate 80, selectively etching an area, oxidizing the selectively etched area to form STI-regions 50, and etching the nitride film. At that time, an area sandwiched by the STI-regions 50 is the AA 60.

Next, masking is performed on the STI-region 50 and the AA 60. Then, the dummy pattern 77 and the GC 40 are formed using lithography and etching. Thus, the configuration illustrated in FIG. 2C is obtained.

Figure 2D:
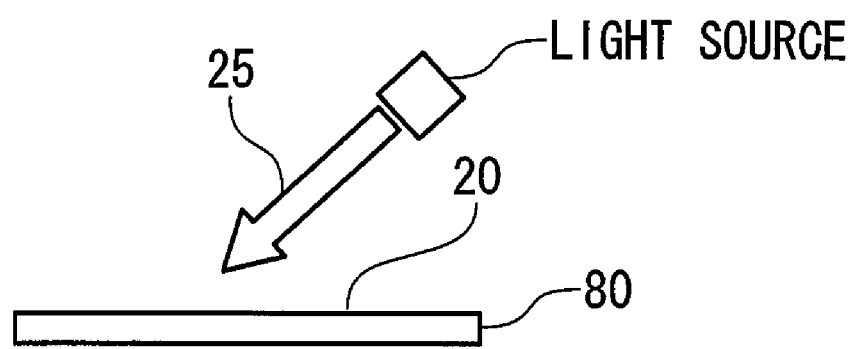

Finally, as illustrated in FIG. 2D, the semiconductor substrate principal surface 20 is processed by raising the temperature of the semiconductor substrate principal surface 20 to high temperature in several milliseconds using an optical annealing process called LSA (Laser Spike Annealing).

The LSA is a technique of using a $CO_2$ laser as a light source, irradiating onto the semiconductor substrate principal surface 20 laser light (light) 25, whose wavelength is equal to or longer than 10 μm and equal to or less than 11 μm, thereby raising the temperature thereof to high temperature equal to or higher than 1000° C. An incidence angle of laser light to the semiconductor substrate principal surface 20 is set at the Brewster's angle at which the absorptance of the light is maximized. Almost 100% of the laser light is absorbed by the semiconductor substrate principal surface 20. Thus, according to the LSA, damage of the device due to reflection light is small, as compared with other optical annealing techniques. The Brewster's angle varies depending on materials. For example, since the Brewster's angle corresponding to a material Si of the GC 40 and the AA 60 is not exactly equal to the Brewster's angle corresponding to a material $SiO_2$ of the STI-region 50, an average value of these Brewster's angles can be used as the incidence angle. According to Embodiment 1, the Brewster's angle is set at about 76°.

Figure 3:
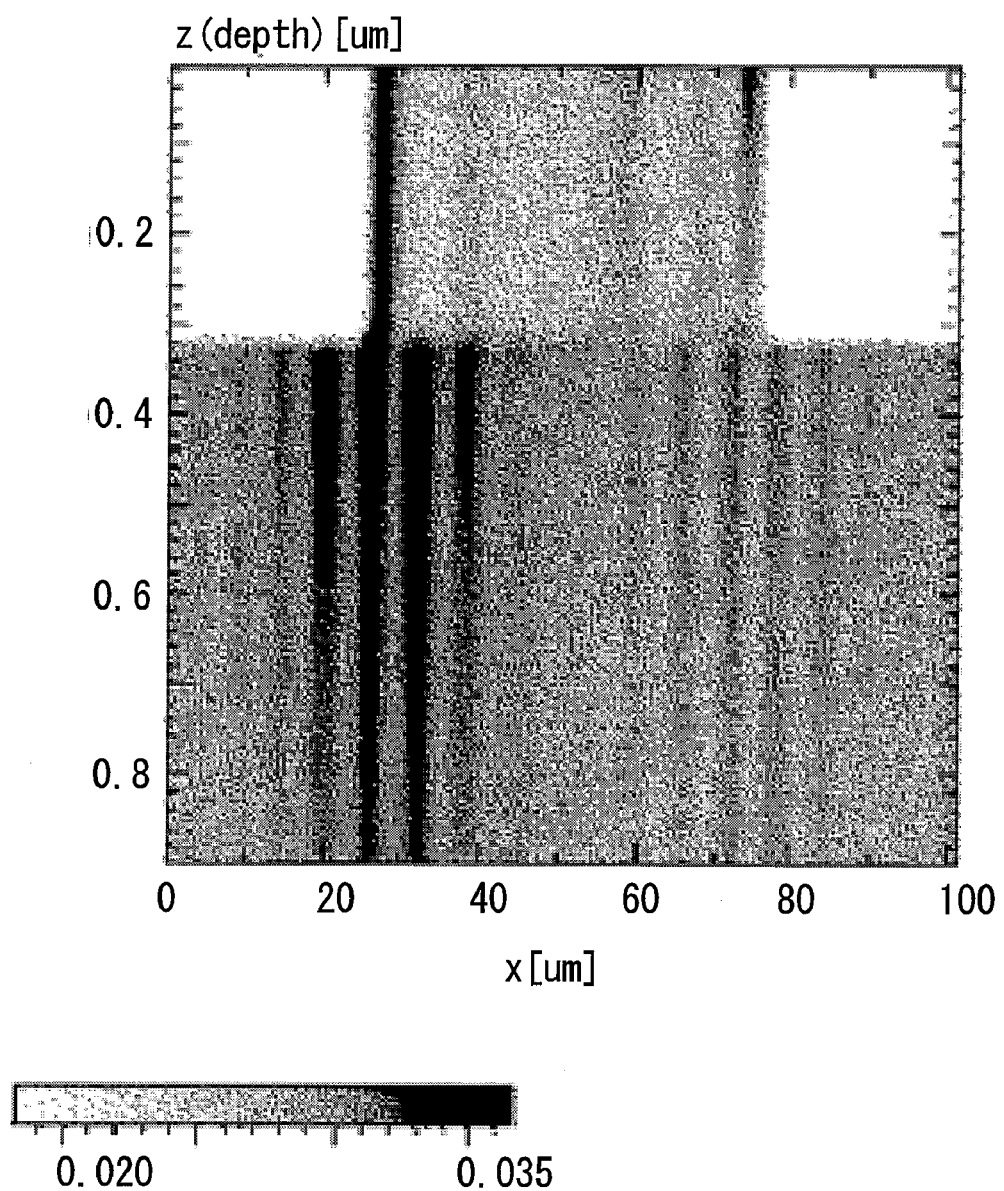
FIG. 3 illustrates a simulation result of change in light absorptance.

FIG. 3 illustrates a result of performing the simulation of the LSA on the semiconductor substrate 80 without using the dummy pattern 77. FIG. 3 illustrates that the AA 60 is formed on the semiconductor substrate 80. The simulation uses RCWA (Rigorous Coupled Wave Analysis) method that can exactly solve the effects of light interference by a vector diffraction technique. An abscissa axis (x-axis) represents a channel length direction. An ordinate axis (z-axis) represents a thickness direction of the semiconductor substrate 80. FIG. 3 illustrates that the darker the color, the higher the light absorptance, i.e., the rise of temperature occurs.

According to the simulation result, the light absorptance of a part at which the rise of temperature occurs is about 2% to about 4% higher than that of other parts. In Embodiment 1, 1% of the light absorptance corresponds to a temperature of about 12° C. That is, a temperature rise of about 24° C. to about 48° C. occurs.

Thus, the occurrence of such temperature rise leads to the deterioration of electrical properties of the finally manufactured semiconductor device 10. Generally, when a temperature change of 20° C. or more occurs, the electric activation degree of Si of a semiconductor device and impurity doped thereinto changes, that the basic characteristics, such as a threshold voltage and a resistance value, of each circuit change. Consequently, the electric characteristics of the device serving as the integrated circuit are deteriorated.

Figure 4:
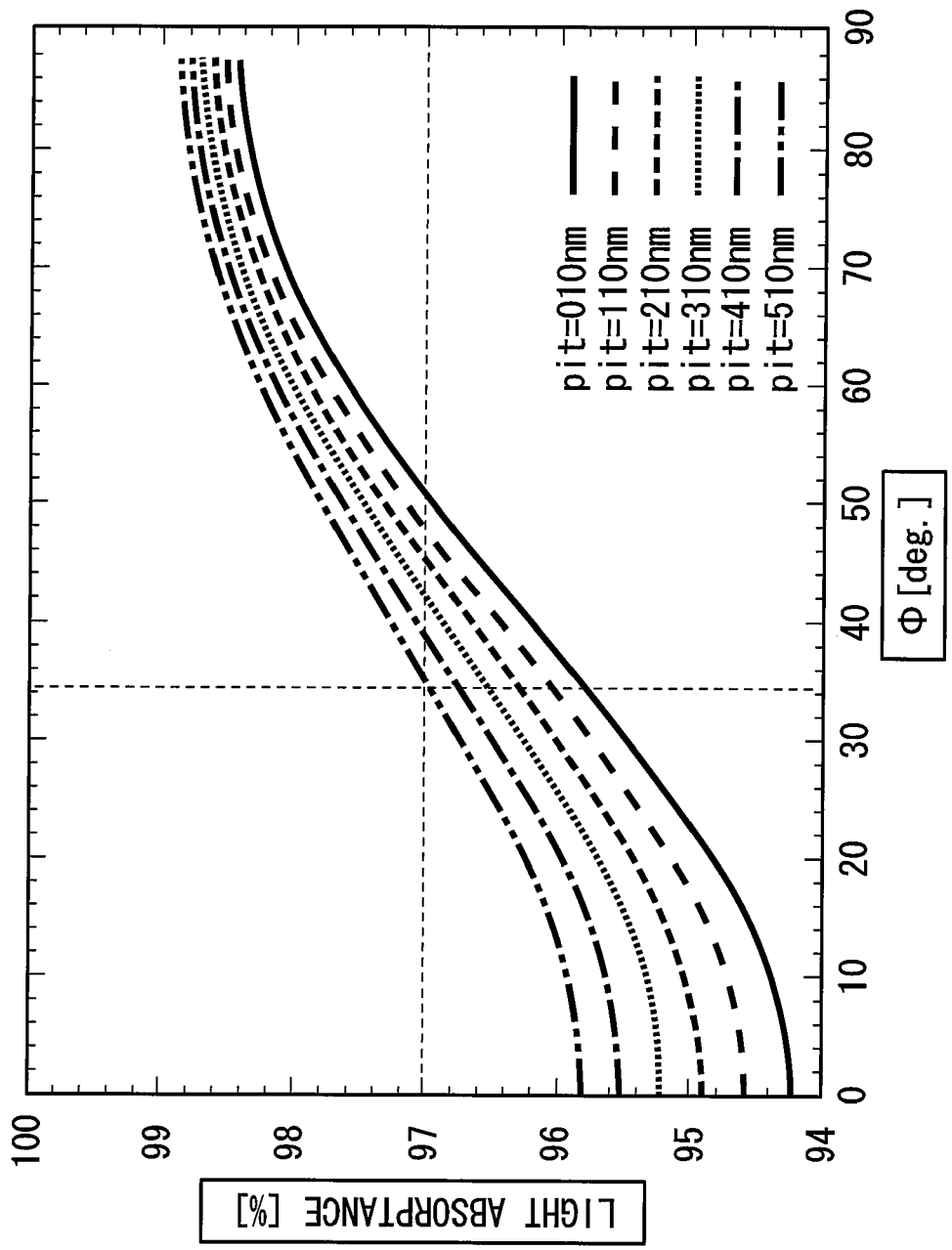
FIG. 4 illustrates change in optical absorptance of a semiconductor substrate with respect to a light irradiating direction.

For example, according to FIGS. 3 and 4 of "Ultra-Shallow Junction Formation by Non-Melt Laser Spike Annealing and its Application to Complementary Metal Oxide Semiconductor Devices in 65-nm Node (A. Shima and A. Hiraiwa)", the resistance value of the circuit depends largely on temperature (laser power), and controlling for uniformizing temperature is desired. A difference in each of the resistance value and the threshold value due to a temperature variation corresponding to 20° C. is intolerable for semiconductor integrated circuits such as logic circuits.

As is seen from FIG. 3, the light absorptance is high at positions whose abscissas have values of 25 μm and 65 μm on the x-axis, i.e., at both ends of the AA 60. This is because of both of the occurrence of the interference between light incident on each end portion and light reflected thereon and the generation of evanescent waves at each of both end-portions of the AA 60. Each of a region in which the incident wave and the reflected wave are interfered with each other so that the electric fields of these waves are strengthened, and a region in which evanescent waves are strongly present is such that the distance from the end of the AA 60 thereto is within a single wavelength of the light. The wavelength of the laser light irradiated thereto is equal to or longer than about 10 μm and equal to or shorter than about 11 μm. Thus, the region in which the absorptance of the light is high is such that the distance from the end of the AA 60 ranges 10 μm to 11 μm or so. In the region in which the absorptance of the light is high, temperature is also high, so that a temperature variation occurs. The rise of temperature causes a temperature variation in the semiconductor substrate circuit. In addition, crystal fault due to thermal stress, the melting of the circuit, the variation in the threshold voltage of the circuit, and the like lead to the degradation of circuit performance.

Thus, according to Embodiment 1, the dummy pattern 77 configured by plural dummy GCs 70 periodically arranged thereon is provided on at least one of the regions each of which is at a distance equal to or longer than 10 μm and equal to or shorter than 11 μm from the associated end of the AA 60. Consequently, the rise of temperature of both ends of the AA 60 can be suppressed for the following reason. That is, the region whose light absorptance is high is at a distance of 10 μm to 11 μm from the associated end of the AA 60. Thus, the light absorptance can be lowered by placing, on this region, the dummy pattern 77 that strongly reflects light. Accordingly, the light absorptance of this region is made to be equal to those of other regions. Consequently, the light absorptance can be uniformized.

That is, the reflection of light is induced in the dummy pattern 77. Thus, excessive light absorption in the AA 60 can be suppressed. However, even if the dummy pattern 77 is placed outside the AA 60, temperature rise occurring at the end of the AA 60 can be reduced due to thermal diffusion effects. Accordingly, the advantages of Embodiment 1 can be obtained by arranging the dummy pattern 77 along the channel length direction.

FIG. 4 illustrates how the light absorptance changes in the semiconductor substrate 80, on which the dummy pattern 77 is arranged, with respect to a rotation angle φ around a rotation axis set to extend in a thickness direction of the semiconductor substrate 80. An abscissa axis represents the rotation angle φ. An ordinate axis represents light absorptance. The thickness of each dummy gate GC 70 is 150 nm.

Figure 5:
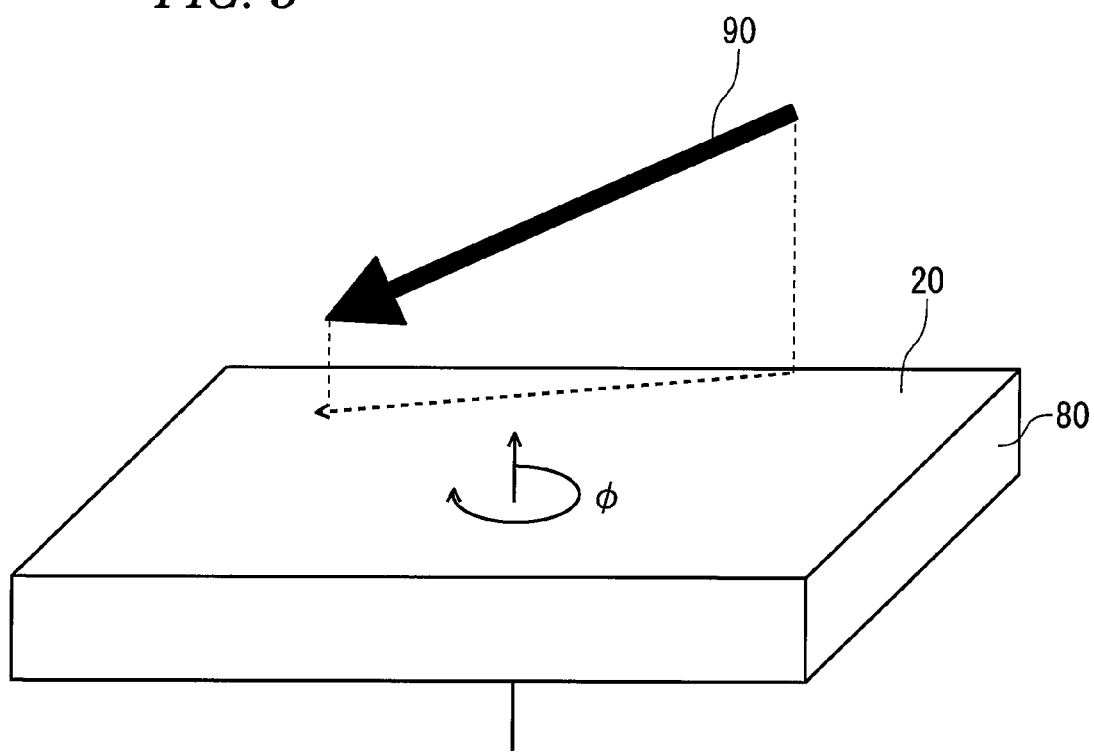
FIG. 5 illustrates Embodiment 1.

When the rotation angle φ is 0 degree, the direction of arranging the plural dummy GCs 70 is parallel to that of projecting laser light. On the other hand, when the rotation angle φ is 90 degree, the direction of arranging the plural dummy GCs 70 is perpendicular to that of projecting laser light. The direction of projecting laser light denotes the direction of projecting the laser light 90 onto the semiconductor substrate principal surface 20, as illustrated in FIG. 5.

Plural lines illustrated in FIG. 4 represent the pitches 75 at each of which the plural dummy GCs 70 are cyclically arranged. The pitch 75 is changed from 10 nm to 510 nm. The relationship between the rotation angle φ and the light absorptance is calculated by the RCWA (Rigorous Coupled Wave Analysis) method.

According to FIG. 4, the light absorptance is at least 94.3%. Usually, the light absorptance is considered to be 100% when the irradiated region is configured only by Si. However, according to Embodiment 1, the GCs 40, the STI-region 50, and the AA 60 are assumed to be configured by Si and $SiO_2$. Thus, the average value of the Brewster's angles is used as the incidence angle. Accordingly, an error of 1% may be caused. That is, in order to realize a temperature drop of about 20° C. or more, as is seen from FIG. 4, the rotation angle φ is set to be equal to or more than 0° and equal to or less than 32° in a range of the pitch 75 of the plural cyclically-arranged dummy GCs 70, which is equal to or longer than 10 nm and equal to or shorter than 510 nm. Thus, the light absorptance can be reduced in a range that is equal to or more than 2% and equal to or less than 4%. That is, temperature can be lowered about 24° C. to about 48° C.

As described above, the pitch 75 of the dummy GCs 70 is set to be equal to and longer than 10 nm and equal to and shorter than 510 nm. The dummy pattern 77 is provided by being arranged at a distance from each of both ends of the AA 60, which is in a range equal to or less than the wavelength of the laser light. The direction of projecting laser light is set at an angle ranging from 0° to 30° with respect to the direction of arranging the dummy GCs 70 forming the dummy pattern 77. Thus, the rise of temperature can be suppressed at the ends of the AA 60. Accordingly, the temperature variation caused in a process of manufacturing the semiconductor device can be reduced.

(Modification 1 of Embodiment 1)

Figure 6:
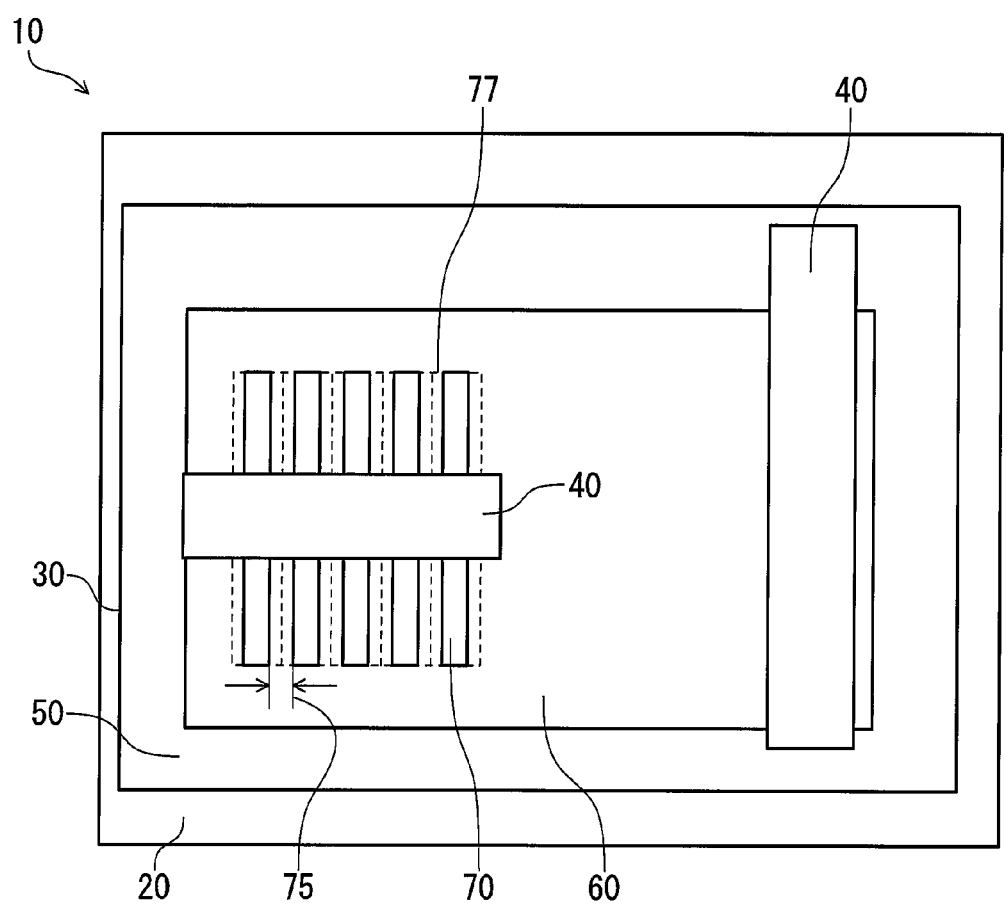
FIG. 6 illustrates Modification 1 of Embodiment 1.

FIG. 6 illustrates Modification 1 of the semiconductor 10 according to Embodiment 1. This modification differs from Embodiment 1 in that the GC 40 is provided across the plural cyclically-arranged dummy GCs 70 on the AA 60.

Thus, even when the GC 40 is provided across the plural dummy GCs 70 thereon, the effects of the interference of light are caused among the dummy GCs 70. Accordingly, temperature can be lowered.

(Modification 2 of Embodiment 1)

Figure 7:
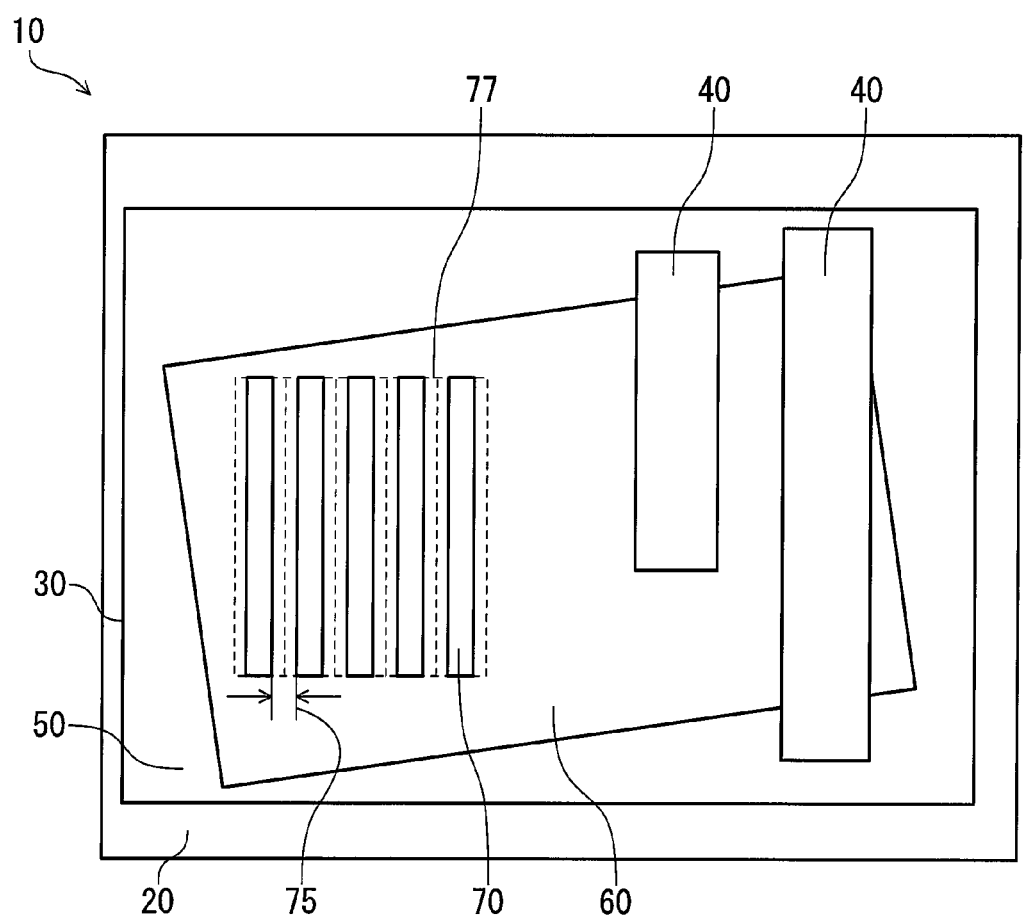
FIG. 7 illustrates Modification 2 of Embodiment 1.

FIG. 7 illustrates Modification 2 of the semiconductor 10 according to Embodiment 1. This modification differs from Embodiment 1 in that the channel length direction of the AA 60 is not in agreement with the direction of cyclically arranging the plural dummy GCs 70 in the semiconductor substrate principal surface 20.

Thus, even if the direction of cyclically arranging the plural dummy GCs 70 is not in agreement with the direction of placing the AA 60, the effects of the interference of light are caused among the dummy GCs 70 thereon. Accordingly, temperature can be lowered.

(Embodiment 2)

Figure 8:
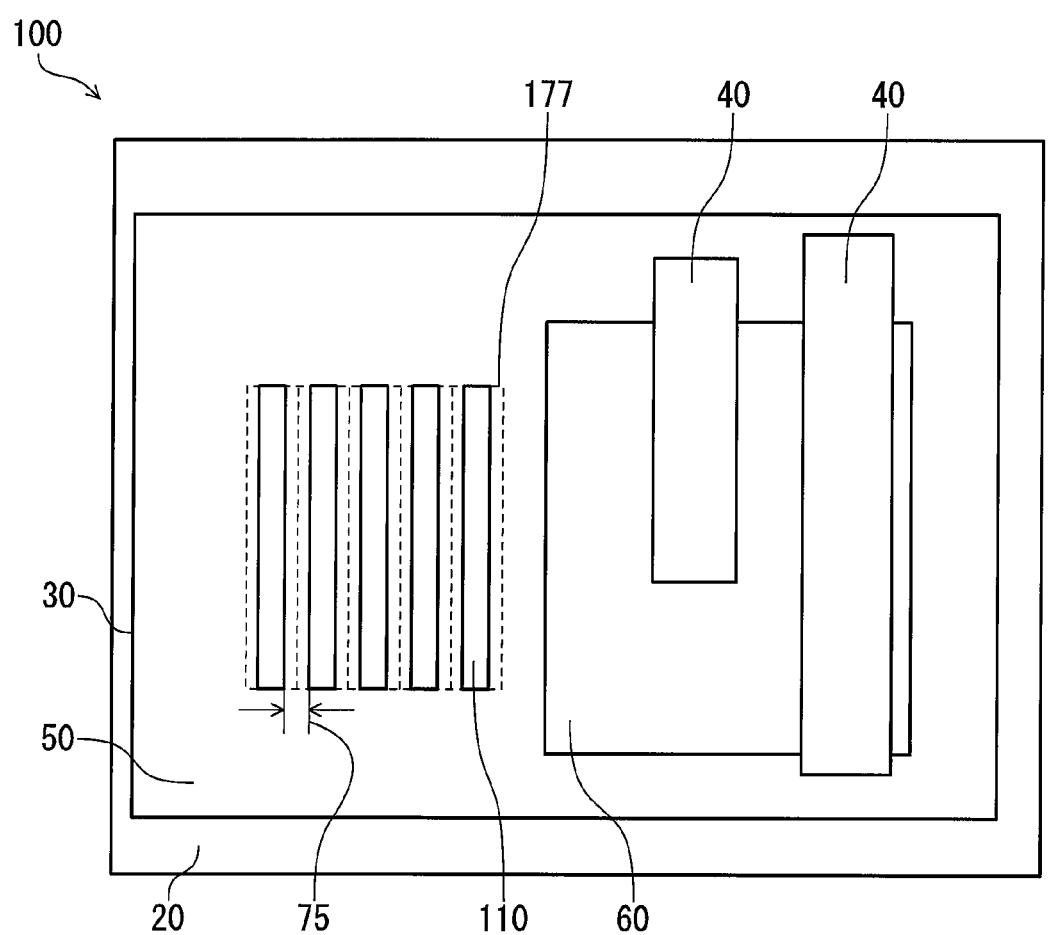
FIG. 8 illustrates a semiconductor device according to Embodiment 2.

FIG. 8 illustrates a semiconductor device 100 according to Embodiment 2. The semiconductor device 100 differs from the semiconductor device 10 in that the dummy pattern 177 having plural cyclically-arranged dummy GCs 110 is provided in a STI-region 50. The description of components of the semiconductor device 100, which are similar to those of the semiconductor device 10, is omitted.

The dummy pattern 177 is provided at a position located at a distance from each end of the AA 60, which ranges from 10 µm to 11 µm.

Figure 9:
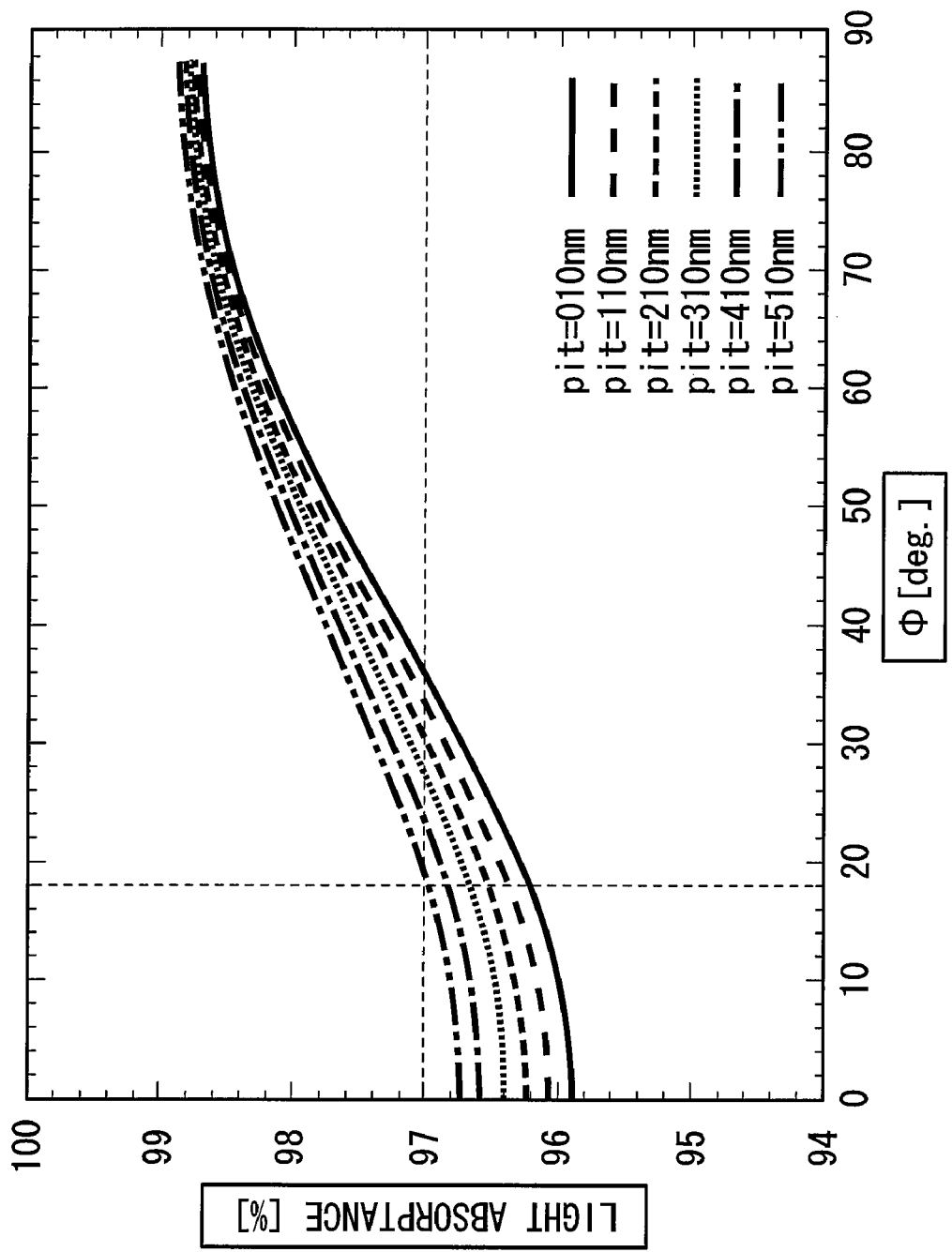
FIG. 9 illustrates a simulation result of change in light absorptance.

FIG. 9 illustrates how the light absorptance changes in the semiconductor substrate 80 with respect to a rotation angle φ around a rotation axis set to extend in a thickness direction of the semiconductor substrate 80. An abscissa axis represents the rotation angle φ. An ordinate axis represents light absorptance. The thickness of the dummy gate GC 110 is 150 nm. When the rotation angle φ is 0°, the direction of arranging the plural dummy GCs 110 is parallel to that of projecting laser light.

Plural lines illustrated in FIG. 9 represent the pitch 75 between the plural cyclically-arranged dummy GCs 110. The pitch 75 is changed in a range that is equal to and longer than 10 nm and equal to and shorter than 510 nm. The relationship between the rotation angle φ and the light absorptance is calculated by the RCWA method.

As is seen from FIG. 9, the light absorptance is at least 94.3%. Usually, the light absorptance is 100% when the irradiated region is configured only by Si. However, according to Embodiment 2, the GC 40 and the STI-region 50 are assumed to be configured by Si and $SiO_2$. The average value of the Brewster's angle obtained from these materials is used as the incidence angle. Thus, an error of 1% may be caused. That is, in order to realize a temperature drop of about 20° C. or more, the rotation angle φ is set to be equal to or more than 0° and equal to or less than 18° in a range of the pitch 75 of the plural cyclically-arranged dummy GCs 110, which is equal to or longer than 10 nm and equal to or shorter than 510 nm. Thus, the light absorptance can be reduced in a range that is equal to or more than about 2% and equal to or less than about 4%. Accordingly, temperature can be lowered about 24° C. to about 48° C.

As described above, the pitch 75 of the dummy GCs 110 is set to be equal to and longer than 10 nm and equal to and shorter than 510 nm. A dummy pattern 177 is provided by being arranged at a distance from the end of the AA 60, which is in a range equal to or less than the wavelength of the laser light. The direction of projecting laser light is set at an angle ranging from 0° to 18° with respect to the direction of arranging the dummy GCs 110 forming the dummy pattern 177. Thus, the rise of temperature can be suppressed at the end of the AA 60. Accordingly, the temperature variation caused in the process of manufacturing the semiconductor device can be reduced.

(Modification 1 of Embodiment 2)

Figure 10:
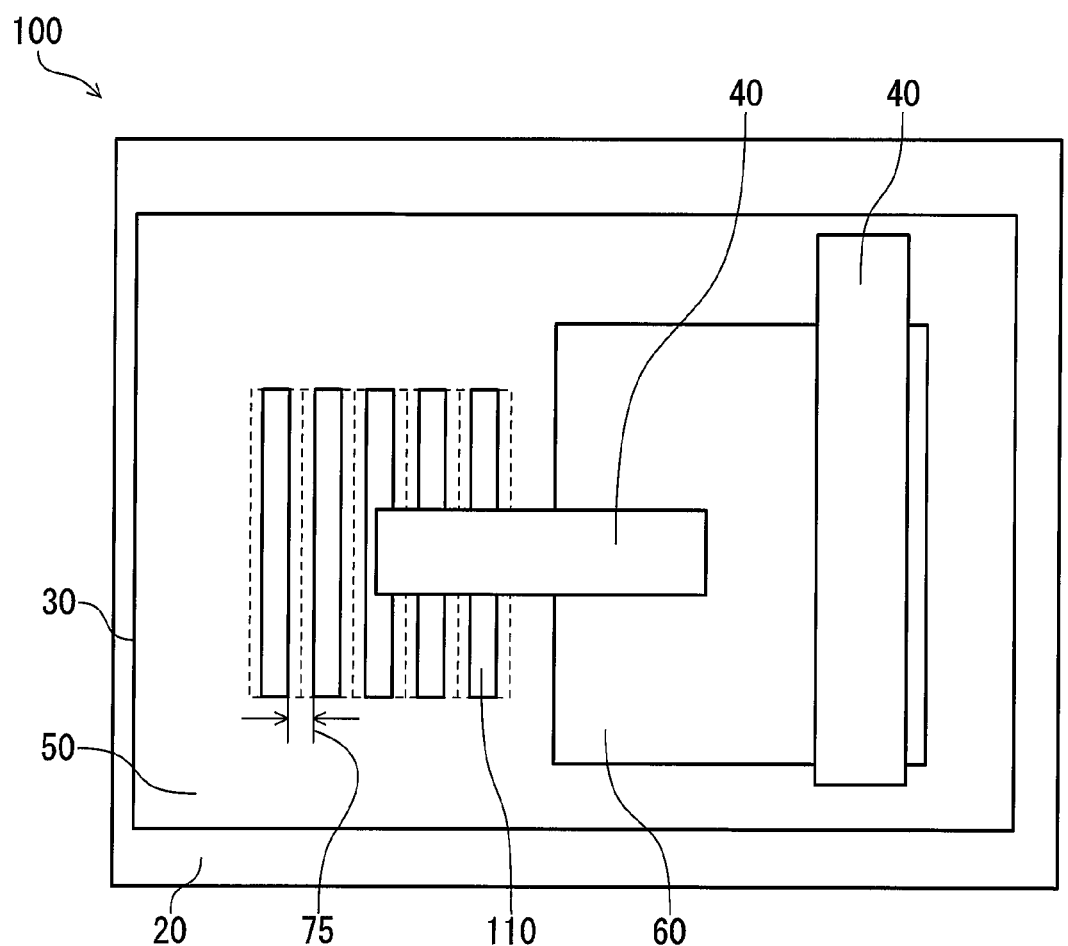
FIG. 10 illustrates Modification 1 of Embodiment 2.

FIG. 10 illustrates Modification 1 of the semiconductor device 100 according to Embodiment 2.

This modification differs from Embodiment 1 in that the GC 40 is provided to extend across the plural cyclically-arranged dummy GC 110 provided on the STI-region 50.

Even in the case of providing the GC 40 to extend across the plural cyclically-arranged dummy GC 110, the effects of the interference of light are caused among the dummy GCs 110. Thus, temperature can be lowered.

(Embodiment 3)

Figure 11:
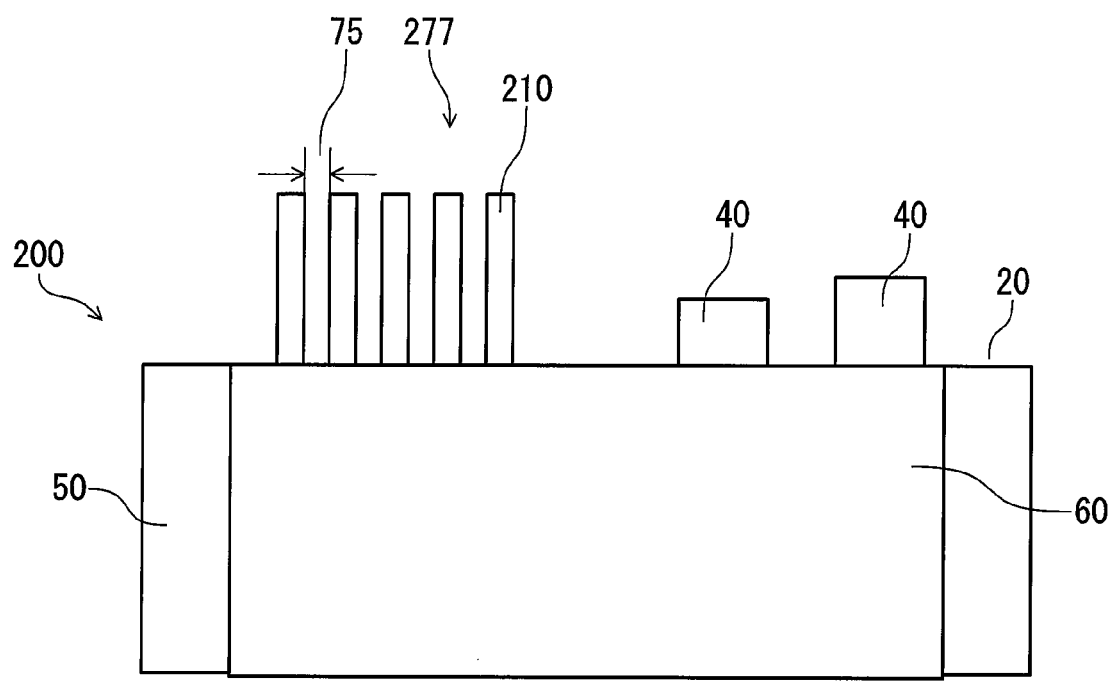
FIG. 11 illustrates a semiconductor device according to Embodiment 3.

FIG. 11 illustrates a semiconductor device 200 according to Embodiment 3. FIG. 11 illustrates a cross-sectional diagram taken along the channel length direction.

The semiconductor device 200 differs from Embodiment 1 in that the film thickness of a dummy GC 210 forming a dummy pattern 277 is changed. The description of components of Embodiment 3, which are similar to those of Embodiment 1, is omitted.

The film thickness of the dummy GC 210 according to Embodiment 3 is equal to or thicker than 300 nm and equal to or thinner than 500 nm.

Figure 12:
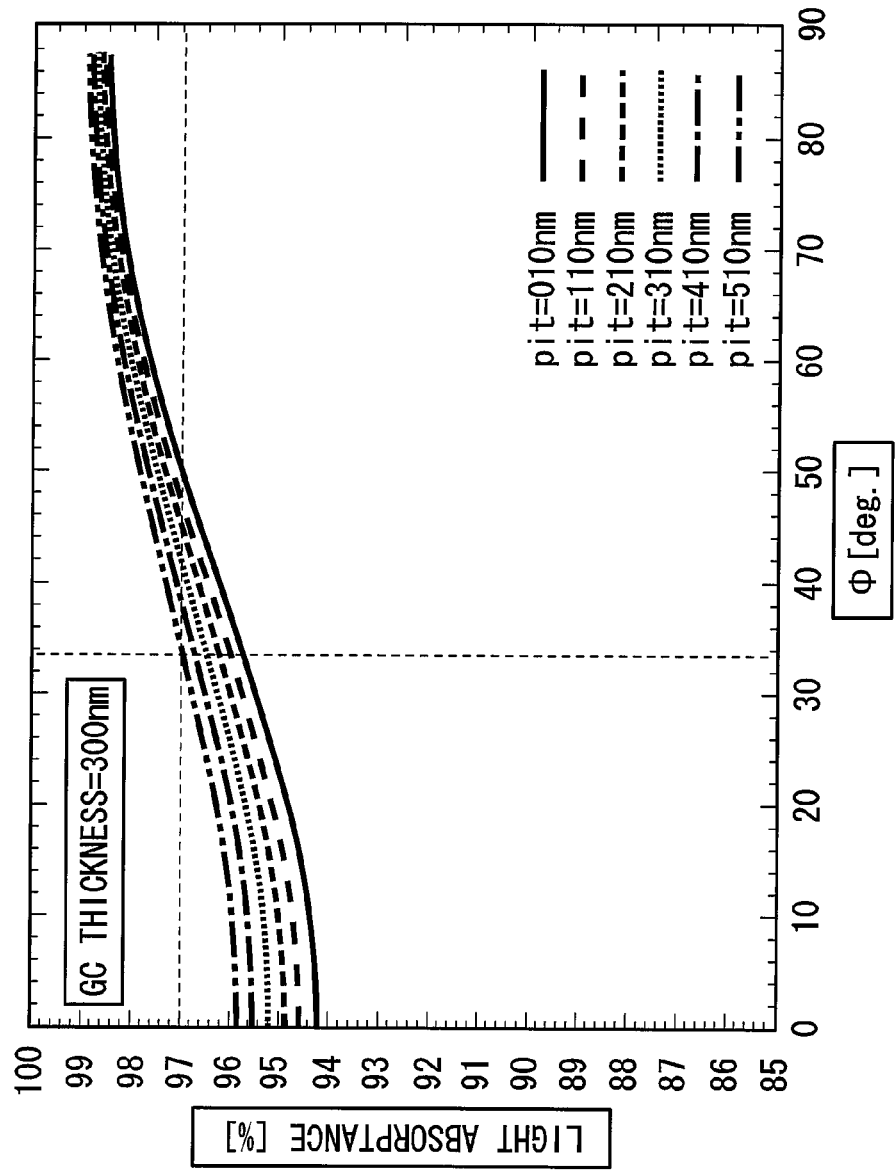
FIG. 12 illustrates a simulation result of light absorptance.

FIG. 12 illustrates how the light absorptance changes in the semiconductor substrate 80 with respect to a rotation angle φ around a rotation axis set to extend in a thickness direction of the semiconductor substrate 80. An abscissa axis represents the rotation angle φ. An ordinate axis represents light absorptance. The rotation angle φ of 0° indicates that the direction of arranging the plural dummy GCs 210 arranged periodically is parallel to that of projecting laser light.

Plural lines illustrated in FIG. 12 represent the pitch 75 between the plural cyclically-arranged dummy GCs 210. The pitch 75 is changed in a range that is equal to and longer than 10 nm and equal to and shorter than 510 nm. The relationship between the rotation angle φ and the light absorptance is calculated by the RCWA method.

Usually, the light absorptance is considered to be 100% when the irradiated region is configured only by Si. However, according to Embodiment 3, the GCs 40, the STI-region 50, and the AA 60 are assumed to be configured by Si and $SiO_2$. Thus, the average value of the Brewster's angles is used as the incidence angle. Accordingly, an error of 1% may be caused.

That is, in order to realize a temperature drop of about 20° C. or more, as is seen from FIG. 12, the rotation angle φ is set to be equal to or more than 0° and equal to or less than 33° in a range of the pitch 75 of the plural cyclically-arranged dummy GCs 210, which is equal to or longer than 10 nm and equal to or shorter than 510 nm. Thus, the light absorptance can be reduced in a range that is equal to or more than 2% and equal to or less than 4%. That is, temperature can be lowered about 24° C. to about 48° C.

Figure 13:
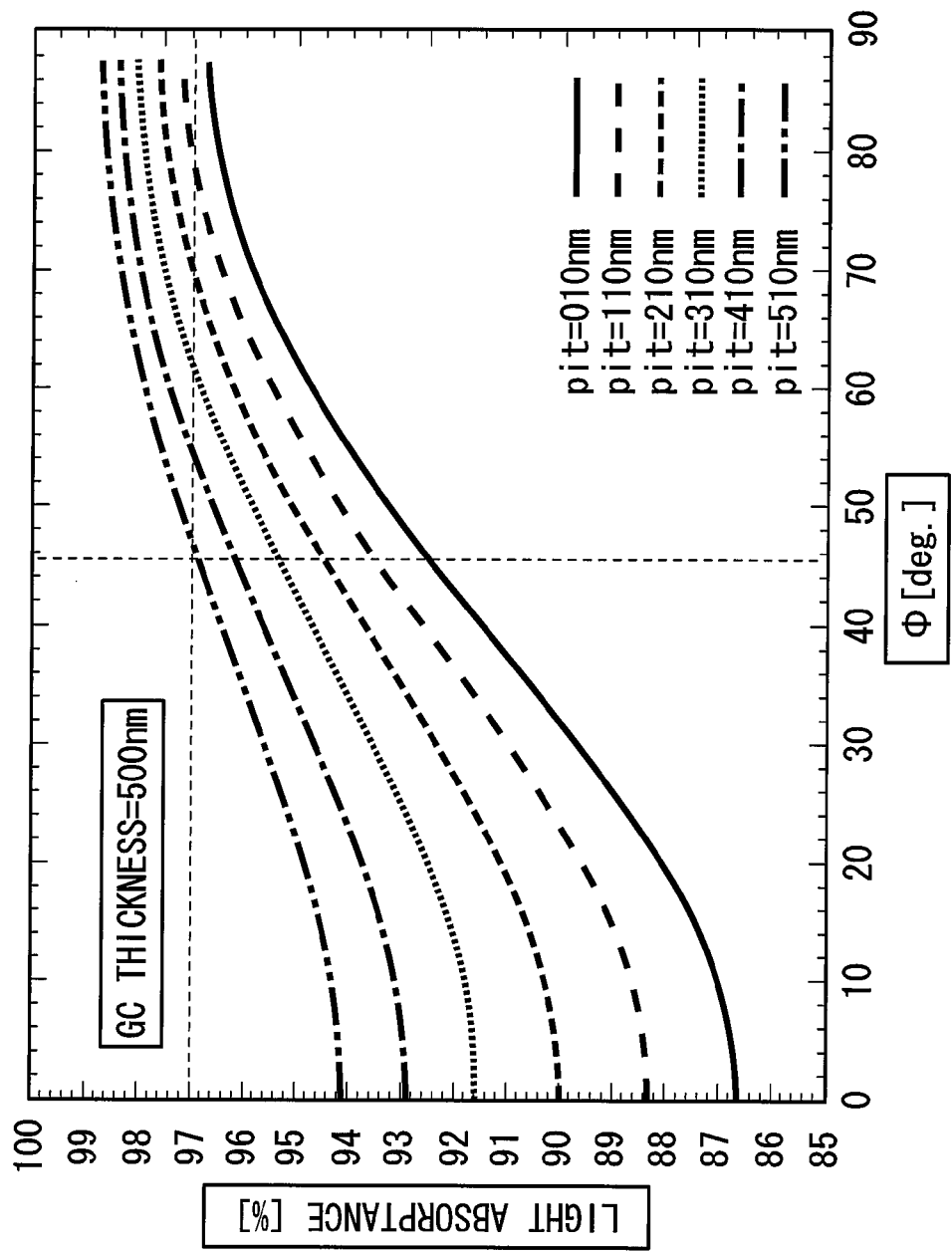
FIG. 13 illustrates a simulation result of light absorptance.

FIG. 13 illustrates how the light absorptance changes in the semiconductor substrate 80 with respect to a rotation angle φ around a rotation axis set to extend in a thickness direction of the semiconductor substrate 80. An abscissa axis represents the rotation angle φ. An ordinate axis represents light absorptance. The rotation angle φ of 0° indicates that the direction of arranging the plural dummy GCs 210 arranged periodically is parallel to that of projecting laser light.

Plural lines illustrated in FIG. 13 represent the pitch 75 between the plural cyclically-arranged dummy GCs 210. The pitch 75 is changed in a range that is equal to and longer than 10 nm and equal to and shorter than 510 nm. The relationship between the rotation angle φ and the light absorptance is calculated by the RCWA method.

Usually, the light absorptance is considered to be 100% when the irradiated region is configured only by Si. However, according to Embodiment 3, the GCs 40, the STI-region 50, and the AA 60 are assumed to be configured by Si and $SiO_2$. Thus, the average value of the Brewster's angles is used as the incidence angle. Accordingly, an error of 1% may be caused.

That is, in order to realize a temperature drop of about 20° C. or more, as is seen from FIG. 13, the rotation angle φ is set to be equal to or more than 0° and equal to or less than 46° in a range of the pitch 75 of the plural cyclically-arranged dummy GCs 70, which is equal to or longer than 10 nm and equal to or shorter than 510 nm.

Thus, the light absorptance can be reduced in a range that is equal to or more than 2% and equal to or less than 4%. That is, temperature can be lowered about 24° C. to about 48° C.

As described above, the thicker the film thickness of the dummy GC, the wider the angular-width of the rotation angle φ. This is because the effect of the light interference is larger in the dummy GC.

Thus, if the dummy pattern 277 is arranged at a distance from each of both ends of the AA 60 within a range equal to or less than a wavelength of laser light 90, temperature can be lowered at a position at which the rise of the temperature of the AA 60 occurs. Accordingly, a semiconductor device can be provided, which is small in temperature variation and high in circuit performance.

The invention claimed is:

1. A semiconductor device manufacturing method, comprising:
    performing a laser spike annealing, by
        irradiating light, whose wavelength is equal to or more than 10 μm and equal to or less than 11 μm, onto a principal surface of a semiconductor substrate, the semiconductor substrate including:
            an active area;
            a circuit pattern formed on the active area, the circuit pattern being associated with a circuit operation; and
            a dummy pattern formed on the active area and at a position, whose distance from an end of the active area is equal to or more than 10 μm and equal to or less than 11 μm, the dummy pattern being associated with no circuit operation, the dummy pattern including a plurality of cyclically arranged dummy gate conductors at a pitch equal to or more than 10 nm and equal to or less than 510 nm,
        while setting an angle formed between an arrangement direction of the dummy gate conductors and a projection direction of the light to be equal to or more than 0° and equal to or less than 30°.

2. A semiconductor device manufacturing method, comprising:
    performing a laser spike annealing, by
        irradiating light, whose wavelength is equal to or more than 10 μm and equal to or less than 11 μm, onto a principal surface of a semiconductor substrate, the semiconductor substrate including:
            an active area;
            a circuit pattern formed on the active area, the circuit pattern being associated with a circuit operation; and
            a dummy pattern formed outside the active area and at a position, whose distance from an end of the active area is equal to or more than 10 μm and equal to or less than 11 μm, the dummy pattern being associated with no circuit operation, the dummy pattern including a plurality of cyclically arranged dummy gate conductors at a pitch equal to or more than 10 nm and equal to or less than 510 nm,
        while setting an angle formed between an arrangement direction of the dummy gate conductors and a projection direction of the light to be equal to or more than 0° and equal to or less than 18°.

* * * * *